United States Patent [19]
Chiu et al.

[11] Patent Number: 5,965,937
[45] Date of Patent: Oct. 12, 1999

[54] THERMAL INTERFACE ATTACH MECHANISM FOR ELECTRICAL PACKAGES

[75] Inventors: Chia-Pin Chiu; Gregory Turturro, both of Chandler, Ariz.

[73] Assignee: Intel Corporation, Santa Clara, Calif.

[21] Appl. No.: 08/990,856

[22] Filed: Dec. 15, 1997

[51] Int. Cl.⁶ ............................. H05K 7/20; H01L 23/16
[52] U.S. Cl. .................. 257/716; 257/699; 257/713; 257/727; 257/726; 257/719; 257/706
[58] Field of Search ................................ 257/713, 727, 257/718, 726, 675, 712, 699, 719; 361/704, 719, 707; 174/16.3; 145/86.3

[56] References Cited

U.S. PATENT DOCUMENTS

| | | | |
|---|---|---|---|
| 4,246,597 | 1/1981 | Cole et al. | 257/719 |
| 4,686,324 | 8/1987 | Debaisieux et al. | 257/727 |
| 4,805,007 | 2/1989 | Schroeder | 257/718 |
| 5,005,638 | 4/1991 | Goth et al. | 257/718 |
| 5,247,425 | 9/1993 | Takahasi | 257/718 |
| 5,500,556 | 3/1996 | Kosugi | 257/718 |
| 5,751,062 | 5/1998 | Daikoku et al. | 257/719 |
| 5,801,330 | 9/1998 | Gademann et al. | 257/719 |

*Primary Examiner*—Alexander Oscor Williams
*Attorney, Agent, or Firm*—Blakely, Sokoloff, Taylor & Zafman LLP

[57] ABSTRACT

An electrical cartridge of the present invention includes a spring that pushes an integrated circuit package into a thermal plate. The integrated circuit package and substrate are attached to a substrate such as a printed circuit board. A cover may be attached to an opposite side of the substrate. There is typically a space between the integrated circuit package and the thermal plate that is filled with a thermal grease. The spring is located between the cover and the substrate in a manner which deflects the spring and exerts a force on the substrate. The spring force pushes the substrate and the integrated circuit package into the thermal plate. The spring may be designed to always provide a sufficient force to ensure a minimum space between the integrated circuit package and the thermal plate for assemblies produced in a mass production process.

4 Claims, 1 Drawing Sheet

THERMAL INTERFACE ATTACH MECHANISM FOR ELECTRICAL PACKAGES

BACKGROUND OF THE INVENTION

1. Field of the Invention

The present invention relates to an electronic cartridge that contains an integrated circuit package(s).

2. Background Information

FIG. 1 shows an electronic cartridge that includes an integrated circuit package 1 which is mounted to a printed circuit board 2. The package 1 contains one or more integrated circuits (not shown). One edge of the circuit board 2 may have a plurality of conductive pads (not shown) that can be plugged into a card edge connector. The card edge connector may be mounted to a motherboard of a computer system.

The assembly may include a thermal plate 3 that is thermally coupled to the integrated circuit package 1. A heat sink (not shown) may be attached to the thermal plate 3 to facilitate the removal of heat generated by the integrated circuits. The printed circuit board 2 may be enclosed by a cover 4.

The integrated circuit generates heat that may flow into the thermal plate 3 through a metal lid 5 of the package 1. Manufacturing tolerances of the assembly may create an air gap between the lid 5 and the thermal plate 3. Air has a relatively low coefficient of thermal conductivity. The existence of an air gap may increase the temperature drop from the package 1 to the thermal plate 3 and the junction temperatures of the integrated circuit.

A thermal grease is typically inserted between the lid 5 and the thermal plate 3 to reduce the temperature drop across the assembly and the junction temperatures of the integrated circuit. Even with the application of a thermal grease the thickness of the space between the lid 5 and the thermal plate 3 may differ between assemblies because of variations in part tolerances. The varying space thickness reduces the predictability of the thermal interface resulting in different junction temperatures for different assemblies. It would be desirable to provide a design that creates a minimum space thickness or bondline for the thermal grease of each assembly.

SUMMARY OF THE INVENTION

An electrical assembly that includes an integrated circuit package that is mounted to a substrate. The substrate may be coupled to a thermal plate that is adjacent to the integrated circuit package. The assembly may also include a spring that exerts a force on the substrate to push the integrated circuit package toward the thermal plate.

DETAILED DESCRIPTION OF THE INVENTION

One embodiment of an electrical cartridge of the present invention includes a spring that pushes an integrated circuit package into a thermal plate. The integrated circuit package and substrate are attached to a substrate such as a printed circuit board. A cover may be attached to an opposite side of the substrate. There is typically a space between the integrated circuit package and the thermal plate that is filled with a thermal grease. The spring is located between the cover and the substrate in a manner which deflects the spring and exerts a force on the substrate. The spring force pushes the substrate and the integrated circuit package toward the thermal plate. The spring may be designed to always provide a sufficient force to ensure a minimum space between the integrated circuit package and the thermal plate for assemblies produced in a mass production process.

Figure 1:
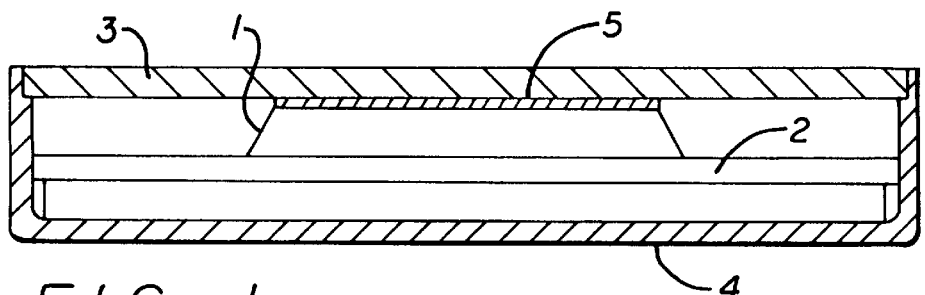
FIG. 1 is a side view of an electrical cartridge.
Figure 2:
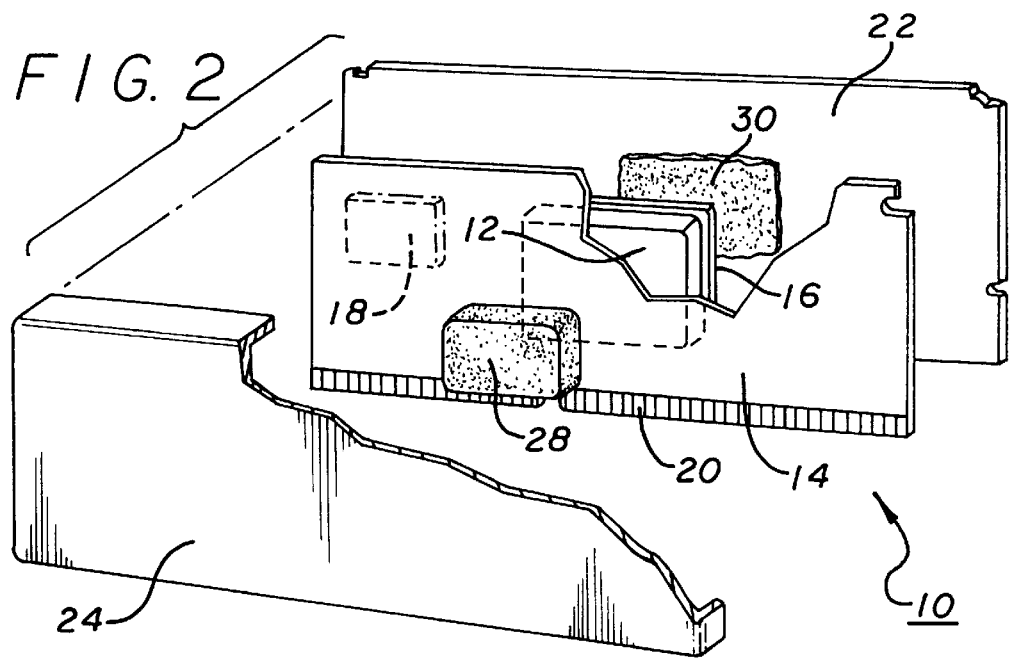
FIG. 2 is an exploded view of an embodiment of an electrical cartridge of the present invention.

Referring to the drawings more particularly by reference numbers, FIG. 2 shows an embodiment of an electrical cartridge 10 of the present invention. The cartridge 10 may include an integrated circuit package 12 that is mounted to a substrate 14. The package 12 typically contains one or more integrated circuits (not shown). Additionally, the package 12 may have a metal lid 16 that is thermally coupled to the integrated circuit. The integrated circuit within the package 12 may be a microprocessor. The cartridge 10 may also have other integrated circuit packages 18 that contain memory devices.

The substrate 14 may be a printed circuit board. One edge of the printed circuit board 14 may have a plurality of conductive pads 20. The pads 20 can be plugged into an electrical connector (not shown) that is mounted to a motherboard (not shown) of a computer system.

The cartridge 10 may further include a thermal plate 22 that is attached to a cover 24. The cover 24 may be attached to the substrate 14. The cover 24 preferably enclose the packages 12 and 18 while exposing the pads 20 so that the cartridge 10 can be plugged into an electrical connector. The thermal plate 22 is typically constructed from a thermally conductive material such as aluminum or copper.

The thermal plate 22 can be thermally coupled to the integrated circuit package 12 to remove heat generated by the integrated circuit. A heat sink (not shown) is typically attached to the outside surface of the thermal plate 22 to facilitate the removal of heat from the package 12.

Located between the cover 24 and the substrate 14 is a spring 28 that pushes the integrated circuit package 12 toward the thermal plate 22. The spring 28 is preferably constructed from an elastomeric material such as urethane or silicon rubber.

Figure 3:
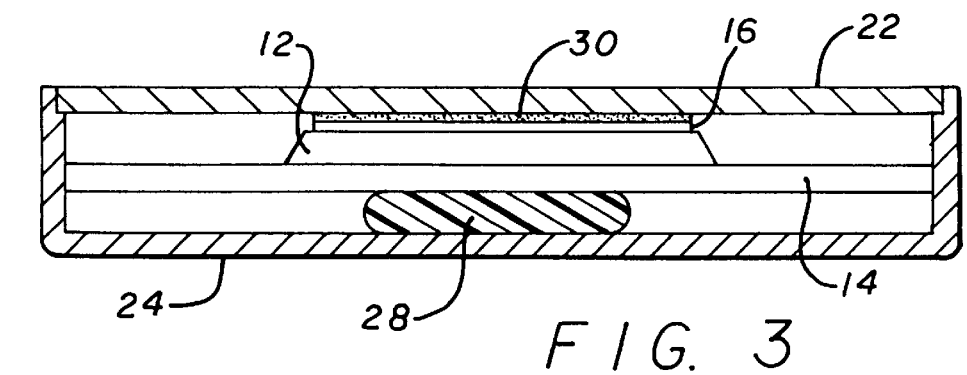
FIG. 3 is a side view of the electrical cartridge.

As shown in FIG. 3, the spring 28 is deflected when assembled into the cartridge 10. The deflected spring 28 exerts a force onto the substrate 14. The spring force pushes the substrate 14 and the integrated circuit package 12 into the thermal plate 22. Heat generated by the integrated circuit of package 12 flows through the lid 16 and into the thermal plate 22. A thermal grease 30 may be placed between the integrated circuit package lid 16 and the plate 22 to prevent air gaps between the lid/plate interface.

The spring 28 may push the package 12 into the thermal plate 22 to insure a thermal grease bondline thickness that is optimized to be a minimum for each cartridge produced in a manufacturing process. The spring 28 may insure a minimum bondline thickness while compensating for different tolerances in the cartridge.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electrical cartridge, comprising:

a substrate which has a conductive pad at an edge;

an integrated circuit package mounted to said substrate;

a cover that is coupled to said substrate to enclose a portion of said substrate while exposing said conductive pad;

a thermal plate that is coupled to said cover and located adjacent to said integrated circuit package; and, a spring that is located between said cover and said substrate and which exerts a force on said substrate to push said integrated circuit package toward said thermal plate.

2. The cartridge as recited in claim 1, further comprising a thermal grease that is located between said thermal plate and said integrated circuit package.

3. The cartridge as recited in claim 2, wherein said spring is constructed from an elastomeric material.

4. The cartridge as recited in claim 1, wherein said integrated circuit package includes a metal lid.

* * * * *